(12) United States Patent
Gajavelly et al.

(10) Patent No.: US 12,422,476 B2
(45) Date of Patent: Sep. 23, 2025

(54) CO-DEBUG OF PROCESSING CONDITIONS OF LOGIC DEVICES

(71) Applicant: INTERNATIONAL BUSINESS MACHINES CORPORATION, Armonk, NY (US)

(72) Inventors: Raj Kumar Gajavelly, Warangal (IN); Arun Joseph, Kadugodi (IN); Rajat Rao, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 56 days.

(21) Appl. No.: 18/438,917

(22) Filed: Feb. 12, 2024

(65) Prior Publication Data
US 2025/0258221 A1    Aug. 14, 2025

(51) Int. Cl.
*G01R 31/317* (2006.01)
*G01R 31/3181* (2006.01)
*G01R 31/3183* (2006.01)

(52) U.S. Cl.
CPC ... *G01R 31/31705* (2013.01); *G01R 31/3181* (2013.01); *G01R 31/318364* (2013.01)

(58) Field of Classification Search
CPC .......... G01R 31/31705; G01R 31/3181; G01R 31/318364
USPC .......... 714/724; 716/51, 104, 106, 111, 112, 716/136
See application file for complete search history.

(56) References Cited

U.S. PATENT DOCUMENTS

| | | | | |
|---|---|---|---|---|
| 6,363,520 B1* | 3/2002 | Boubezari | ...... | G01R 31/318364 716/106 |
| 6,389,566 B1* | 5/2002 | Wagner | .......... | G01R 31/318541 327/202 |
| 6,536,019 B1 | 3/2003 | Oyuang | | |
| 6,904,577 B2* | 6/2005 | Schubert | ........ | G01R 31/318364 716/108 |

(Continued)

FOREIGN PATENT DOCUMENTS

WO      2014184612 A1    11/2014

OTHER PUBLICATIONS

Wang et al., Optimization of Multiplexer Combination in RTL Logic Synthesis, 2023, IEEE, pp. 121-125 (Year: 2023).*

(Continued)

*Primary Examiner* — John J Tabone, Jr.
(74) *Attorney, Agent, or Firm* — Edward J. Wixted, III, Esq.; Blanche E. Schiller, Esq.; Heslin Rothenberg Farley & Mesiti P.C.

(57) ABSTRACT

A multiplexer logic device is automatically identified in a hardware definition language of a design. One or more verification properties of the multiplexer logic device are generated to be used in validation of a selected processing condition of the multiplexer logic device. The one or more verification properties and one or more constraints obtained from software and hardware information relating to the multiplexer logic device are provided as input to a formal verification technique. Verification is performed using the formal verification technique to validate the selected processing condition. Based on the performing verification indicating a failure to comply with the selected processing condition, debugging of the multiplexer logic device is performed.

20 Claims, 5 Drawing Sheets

(56) References Cited

U.S. PATENT DOCUMENTS

| | | | |
|---|---|---|---|
| 7,065,481 B2* | 6/2006 | Schubert | G01R 31/318364 703/15 |
| 7,240,303 B1 | 7/2007 | Schubert et al. | |
| 7,757,191 B2 | 7/2010 | Chan | |
| 10,579,770 B2 | 3/2020 | Nalla et al. | |
| 11,354,130 B1 | 6/2022 | Borkovic | |
| 2008/0148214 A1* | 6/2008 | Yancey | G06F 30/34 716/108 |
| 2010/0095255 A1 | 4/2010 | Thompson et al. | |
| 2017/0272077 A1* | 9/2017 | Sharma | H03K 19/1737 |
| 2018/0032357 A1 | 2/2018 | Suresh et al. | |
| 2025/0155916 A1* | 5/2025 | Bhat | B60W 50/06 |

OTHER PUBLICATIONS

Gharehbaghi et al., Formal Verification Guided Automatic Design Error Diagnosis and Correction of Complex Processors, 2011, IEEE, pp. 121-127. (Year: 2011).*

Alizadeh et al., Debugging and Optimizing High Performance Superscalar Out-of-Order Processors Using Formal Verification Techniques, 2011, IEEE, pp. 297-301. (Year: 2011).*

Xu, Y. et al., "Practical Application of Formal Verification Techniques on a Frame Mux/Demux Chip from Nortel Semiconductors," CHARME'99, LNCS 1703, Jan. 1999, pp. 110-124.

CWE, "CWE-1298: Hardware Logic Contains Race Conditions (4.13)," https://cwe.mitre.org/data/definitions/1298.html, downloaded from internet Dec. 11, 2023, pp. 1-2.

Madhavan, Advait et al., "Race Logic: Abusing Hardware Race Conditions to Perform Useful Computation," IEEE Computer Society, Jun. 2015, pp. 48-57.

Wang, Yu et al., "Automatic Detection, Validation and Repair of Race Conditions in Interrupt-Driven Embedded Software," Journal of Latex Class Files, vol. 14, No. 8, Aug. 2014, pp. 1-18.

Glokler et al. "Enabling Large-Scale Pervasive Logic Verification through Multi-Algorithmic Formal Reasoning", 2006 Formal Methods in Computer Aided Design, Dec. 11, 2006, 8 pages.

* cited by examiner

CO-DEBUG OF PROCESSING CONDITIONS OF LOGIC DEVICES

BACKGROUND

One or more aspects relate, in general, to processing within a computing environment, and in particular, to processing relating to processing conditions of logic devices.

As used herein, a processing condition is an event or condition related to processing of a logic device, such as a multiplexer logic device. One example of a processing condition is a mutual exclusion condition in which it is expected that one signal of a plurality of signals input to a logic device (e.g., multiplexer logic device) is to be active at one time. Such a condition exists in a hardware design in which the design logic receives inputs from signals that have different paths, while originating from the same source. The changes in output depend upon input changes at the source signals.

If the input changes occur during different times, this can cause unexpected behavior and expose concerns which may be exploited to gain access to protected regions of the design.

SUMMARY

Shortcomings of the prior art are overcome, and additional advantages are provided through the provision of a computer-implemented method of facilitating processing within a computing environment. The computer-implemented method includes automatically identifying a multiplexer logic device in a hardware definition language of a design. One or more verification properties of the multiplexer logic device are generated to be used in validation of a selected processing condition of the multiplexer logic device. The one or more verification properties and one or more constraints obtained from software and hardware information relating to the multiplexer logic device are provided as input to a formal verification technique. Verification is performed using the formal verification technique to validate the selected processing condition. Based on the performing verification indicating a failure to comply with the selected processing condition, debugging of the multiplexer logic device is performed.

Computer-implemented methods, computer systems and computer program products relating to one or more aspects are described and claimed herein. Each of the embodiments of the computer-implemented method may be embodiments of each computer system and/or each computer program product and vice-versa. Further, each of the embodiments is separable and optional from one another. Moreover, embodiments may be combined with one another. Each of the embodiments of the computer-implemented method may be combinable with aspects and/or embodiments of each computer system and/or computer program product, and vice-versa. Further, services relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

Figure 1:
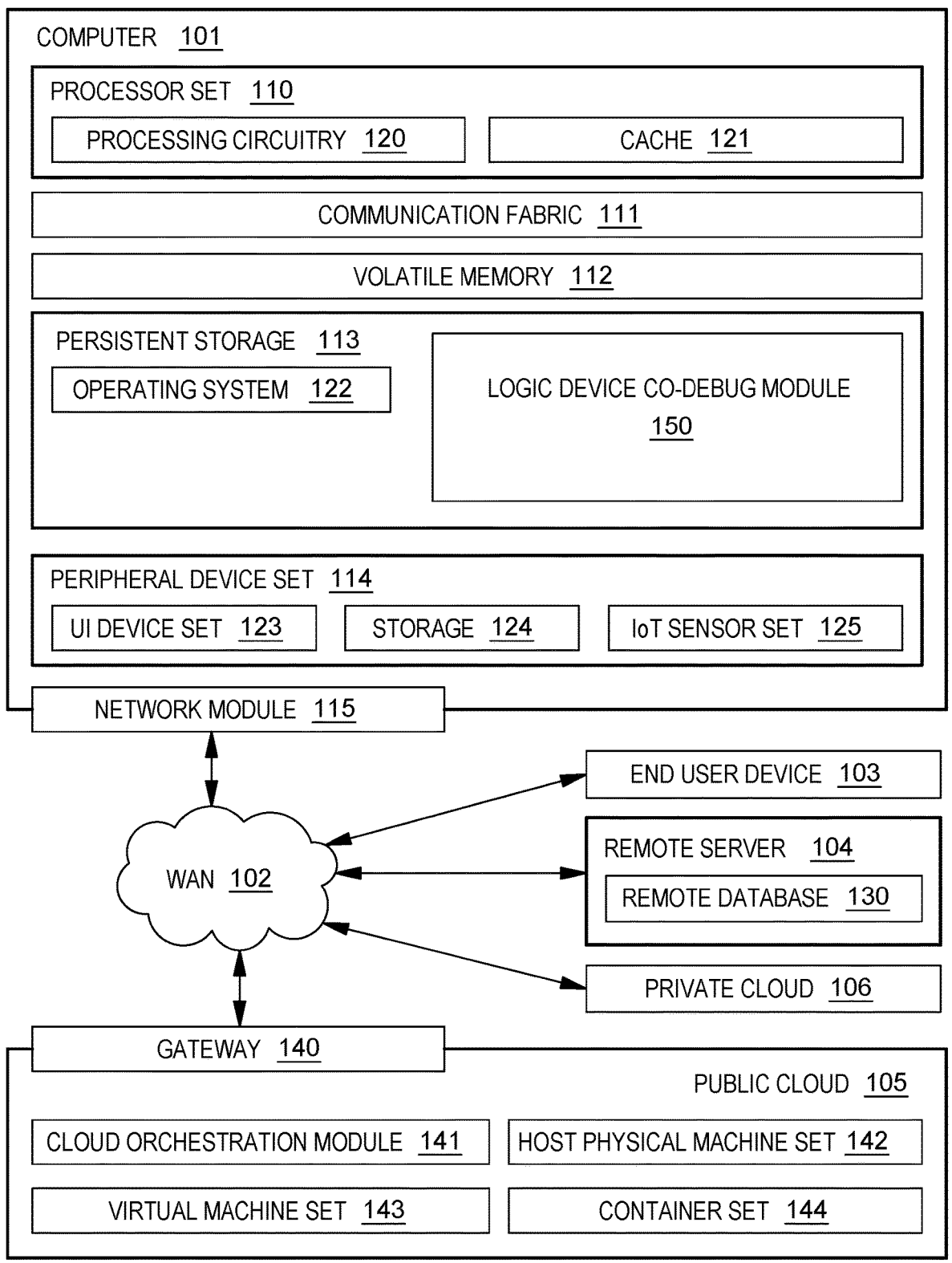
FIG. 1 depicts one example of a computing environment to incorporate and use one or more aspects of the present disclosure.

In accordance with one or more aspects of the present disclosure, a capability is provided to facilitate processing within a computing environment. In one or more aspects, the capability includes debugging logic devices of the computing environment to remove deficiencies, thereby improving performance, accuracy and security within the computing environment. In one or more aspects, as used herein, a logic device is a logic device and/or a design of the logic device.

In one particular example, the logic device is a multiplexer logic device in which a chain of multiplexers is driving a logic circuit (e.g., an OR gate). For instance, a plurality of multiplexers (e.g., two multiplexers) are coupled to and driving a logic gate (e.g., an OR gate). Other examples are possible including the multiplexer logic device having more than two multiplexers driving the logic circuit. Further, other logic circuits may be used. Many possibilities exist.

In one or more aspects, the debug capability includes automatically verifying whether there is a failure to comply with selected processing conditions, and if there is such a failure to comply, performing one or more actions to correct any deficiencies. In one or more aspects, the debug capability includes a co-debug process in which both software and hardware relating to the logic device (e.g., multiplexer logic device) are debugged (e.g., concurrently).

One or more aspects of the present disclosure are incorporated in, performed and/or used by a computing environment. As examples, the computing environment may be of various architectures and of various types, including, but not limited to: personal computing, client-server, distributed, virtual, emulated, partitioned, non-partitioned, cloud-based, quantum, grid, time-sharing, cluster, peer-to-peer, wearable, mobile, having one node or multiple nodes, having one processor or multiple processors, and/or any other type of environment and/or configuration, etc. that is capable of executing a process (or multiple processes) that performs, e.g., debug processing and/or one or more other aspects of the present disclosure. Aspects of the present disclosure are not limited to a particular architecture or environment.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

One example of a computing environment to perform, incorporate and/or use one or more aspects of the present disclosure is described with reference to FIG. 1. In one example, a computing environment 100 contains an example of an environment for the execution of at least some of the computer code involved in performing the inventive methods, such as logic device co-debug code or module 150. In addition to block 150, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 150, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

Computer 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

Processor set 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 150 in persistent storage 113.

Communication fabric 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

Persistent storage 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 150 typically includes at least some of the computer code involved in performing the inventive methods.

Peripheral device set 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

Network module 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

Remote server 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

Public cloud 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

The computing environment described above is only one example of a computing environment to incorporate, perform and/or use one or more aspects of the present disclosure. Other examples are possible. For instance, in one or more embodiments, one or more of the components/modules of FIG. 1 are not included in the computing environment and/or are not used for one or more aspects of the present disclosure. Further, in one or more embodiments, additional and/or other components/modules may be used. Other variations are possible.

As indicated, one example of a processing condition relating to processing of a logic device is a mutual exclusion condition (also referred to as a processing-race condition) that occurs when the logic receives inputs from signals that have different paths, while originating from the same source. The changes in output depend upon input changes at the source signals. If the input changes occur during different times, this can cause unexpected behavior and expose concerns which may be exploited to gain access to protected regions of the design.

Figure 2:
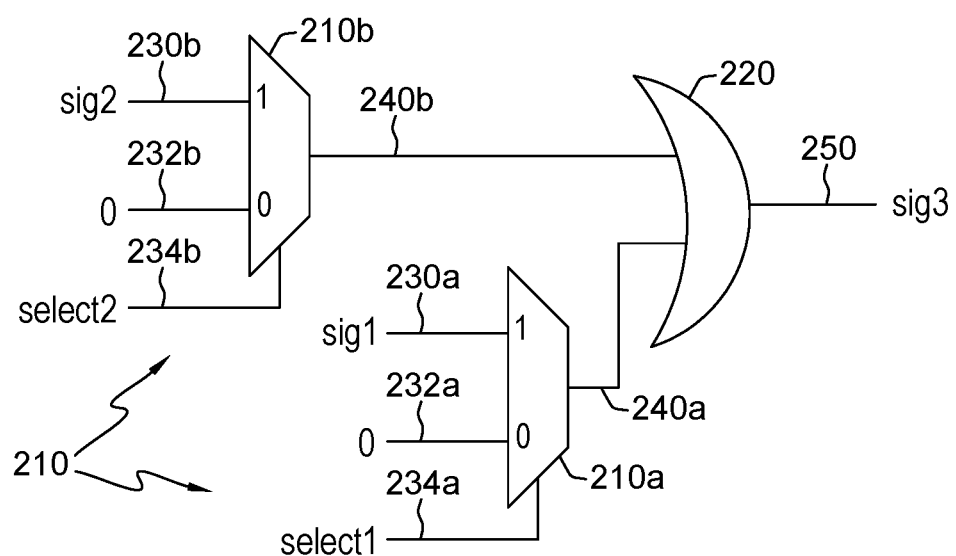
FIG. 2 depicts one example of a multiplexer logic device for which one or more aspects of the present disclosure are used.

One example of a logic device having a processing condition associated therewith is depicted in FIG. 2. As depicted in FIG. 2, a multiplexer logic device 200 includes a chain of multiplexers (MUXes) driving a logic circuit (e.g., OR gate). For instance, multiplexer logic device 200 includes a plurality of multiplexers 210 coupled to an OR gate 220. As an example, a multiplexer 210*a* of the plurality of multiplexers 210 has a plurality of inputs 230*a*, 232*a*, one of which is selected by a select control 234*a* (also referred to as a select signal) to produce an output 240*a*. Similarly, a multiplexer 210*b* of the plurality of multiplexers 210 has a plurality of inputs 230*b*, 232*b*, one of which is selected by a select control 234*b* (also referred to as a select signal) to produce an output 240*b*. Each output 240*a*, 240*b* is input to OR gate 220, which produces an output 250 (e.g., sig3).

With the above-described logic device, only one condition in {select1, select2} is to be active or high, otherwise the output at sig3 (250) may be corrupted. Thus, a multiplexer select is to be mutually exclusive. This is to be verified (e.g., during testing prior and/or subsequent to manufacturing) to avoid a possibility of incorrect logic behavior and design errors (also referred to as bugs).

Although, in one or more aspects, multiplexer logic devices are being verified and/or debugged, one or more aspects of the present disclosure may be used to verify and/or debug other logic devices. Multiplexer logic devices are only one example. Further, the mutual exclusion condition is only one example. One or more aspects of the present disclosure may be used for other types of logic devices and/or other processing conditions.

In accordance with one or more aspects of the present disclosure, a capability is provided to debug processing conditions, such as mutual exclusion conditions in logic devices (e.g., multiplexer logic designs and/or devices). In one or more aspects, the debug capability includes automatically verifying whether there is a failure to comply with such processing conditions, and if there is such a failure to comply, performing one or more actions to correct any deficiencies. In one or more aspects, the debug capability includes a co-debug process in which both software and hardware relating to the logic device are debugged (e.g., concurrently).

In one example, to debug logic devices, a logic device co-debug module (e.g., logic device co-debug module 150) is used, in accordance with one or more aspects of the present disclosure. A logic device co-debug module (e.g., logic device co-debug module 150) includes code or instructions used to perform logic device co-debug processing and/or other processing, in accordance with one or more aspects of the present disclosure. A logic device co-debug module (e.g., logic device co-debug module 150) includes, in one example, various sub-modules to be used to perform debug processing and/or other processing of one or more aspects of the present disclosure. The sub-modules are, e.g., computer readable program code (e.g., instructions) in computer readable storage media, e.g., storage (persistent storage 113, cache 121, storage 124, other storage, as examples). The computer readable storage media may be part of one or more computer program products and the computer readable program code may be executed by and/or using one or more computing devices (e.g., one or more computers, such as computer(s) 101 and/or other computers; one or more servers, such as remote server(s) 104 and/or other remote servers; one or more devices, such as end user device(s) 103 and/or other end user devices; one or more processors or nodes, such as processor(s) or node(s) of processor set 110 and/or other processor(s) or node(s); processing circuitry, such as processing circuitry 120 of processor set 110 and/or other processing circuitry and/or other computing devices, etc.). Additional and/or other computers, servers, devices, processors, nodes, processing circuitry and/or computing devices may be used to execute one or more of the sub-modules and/or portions thereof. Many examples are possible.

Figure 3:
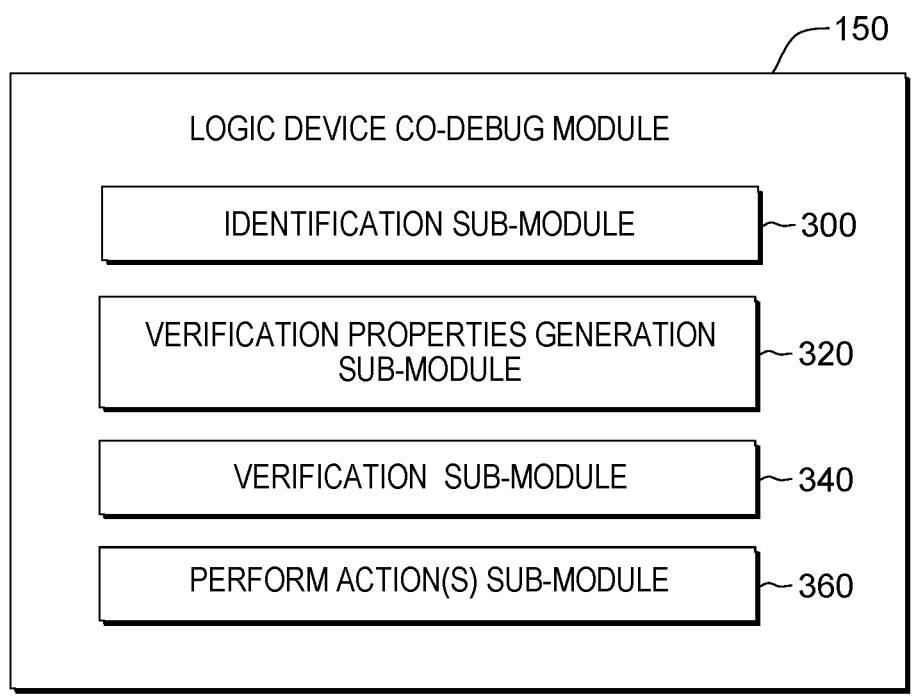
FIG. 3 depicts one example of a logic device co-debug module used in accordance with one or more aspects of the present disclosure.

One example of logic device co-debug module 150 is described with reference to FIG. 3. In one example, logic device co-debug module 150 includes, for instance, an identification sub-module 300 to be used in identifying the logic devices to be verified and/or debugged; a verification properties generation sub-module 320 to be used in generating (e.g., automatically) verification properties for the identified logic devices; a verification sub-module 340 to be used in performing verification of the identified logic devices; and a perform action(s) sub-module 360 to be used in performing one or more actions to debug the logic devices. Logic device co-debug module 150 may include additional, fewer and/or other sub-modules. Many variations are possible. Further, similar modules/sub-modules may be used for other selected purposes.

One or more of the sub-modules (e.g., sub-modules 300-360) are used, in one example, in performing co-debugging of identified logic devices. In one example, referring to FIG. 4, a logic device co-debug process (e.g., logic device co-debug process 400) is used to perform co-debugging of identified logic devices. Logic device co-debug process 400 may be executed by and/or using one or more computing devices (e.g., one or more computers, such as computer(s) 101 and/or other computers; one or more servers, such as remote server(s) 104 and/or other remote servers; one or more devices, such as end user device(s) 103 and/or other end user devices; one or more processors or nodes, such as processor(s) or node(s) of processor set 110 and/or other processor(s) or node(s); processing circuitry, such as processing circuitry 120 of processor set 110 and/or other processing circuitry and/or other computing devices, etc.). Additional and/or other computers, servers, devices, processors, nodes, processing circuitry and/or computing devices may be used to execute the process and/or other aspects of the present disclosure. Many examples are possible.

Figure 4:
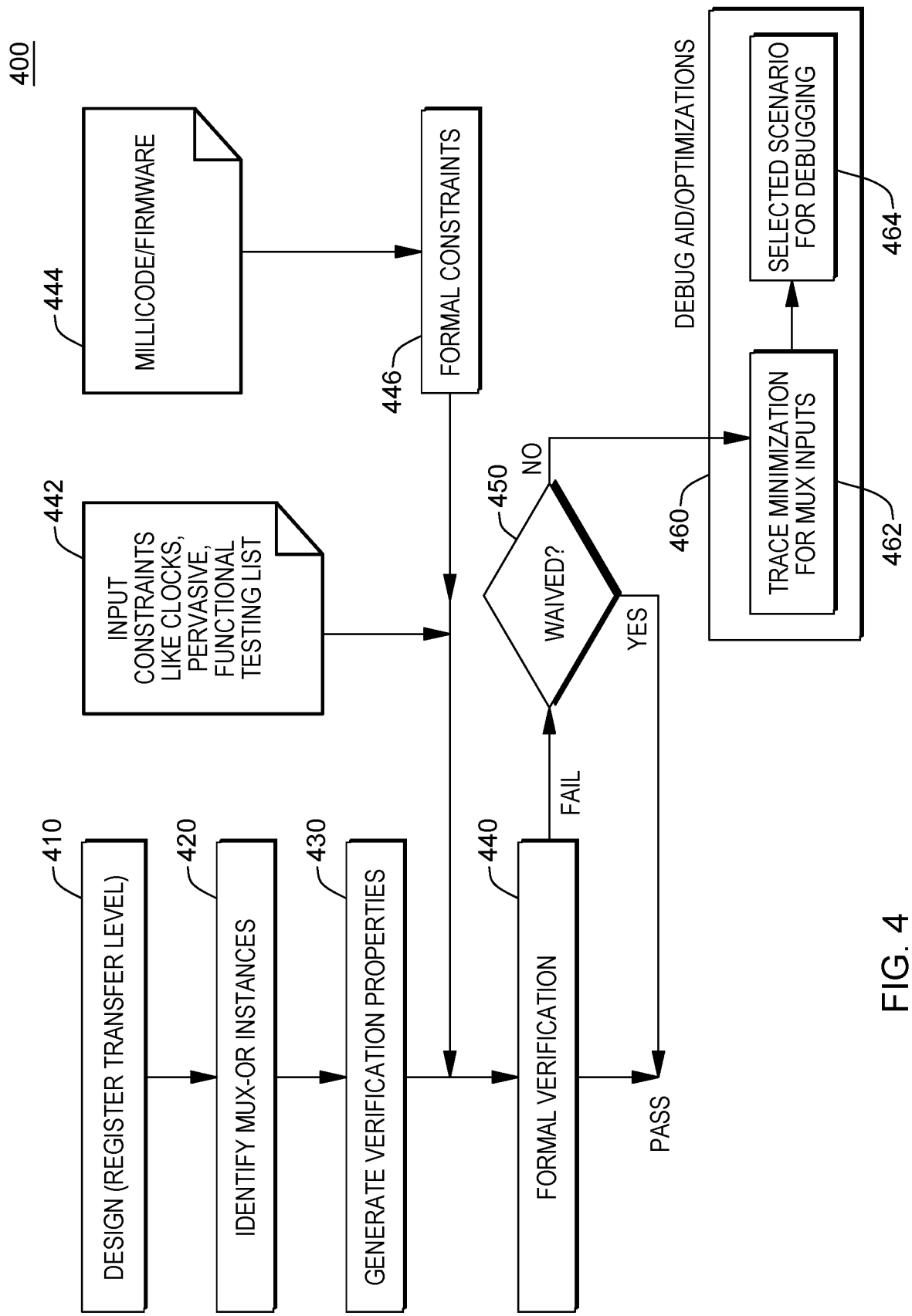
FIG. 4 depicts one example of a logic device co-debug process, in accordance with one or more aspects of the present disclosure.

Referring to FIG. 4, in one example, logic device co-debug process 400 (also referred to as process 400) obtains 410 a description of a design, such as, e.g., a register transfer level description of a design that includes one or more logic devices. In one example, at least one of the logic devices is a multiplexer logic device. Process 400 identifies 420 one or more multiplexer logic devices (e.g., MUX-OR instances) in the design and, in one example, extracts a description of the one or more multiplexer logic devices from the description of the design. Further, process 400 generates 430 one or more verification properties for the one or more identified multiplexer logic devices. For example, one or more verification properties are automatically generated based on the identified logic devices and input to a formal verification technique to check if there is, e.g., a potential for more than one select of a multiplexer logic device to go active at one time.

One example of pseudo-code to be used to automatically generate verification properties to be used in verification of selected processing conditions (e.g., mutual exclusion conditions) is provided below:

```
Generate_MuxSelectRace_OneHot_Property (Muxes) {
    Inv_Property=0; //create an inverse property
    //Create OR gate for at least one active condition
    For each m1 in Muxes{
        activeSelects=1
        For each m2 in Muxes {
            If (m1==m2) {
                activeSelects=activeSelects AND m2.select;
            }
            Else {
                activeSelects=activeSelects AND NOT m2.select;
            }
        }
        Inv_property=Inv_propert OR activeSelects
    }
    //Block none of the muxes are active
    NoneActive=1;
    For each m in Muxes {
        NoneActive=BlockNoneActive AND NOT m.select;
    }
    Property=NOT Inv_property AND NOT NoneActive;
    Return Property;
}
```

The above pseudo-code automatically generates a property (e.g., based on identification of a multiplexer logic device) that indicates that only one select control of a multiplexer logic device is active (e.g., 1) at any one time. Scenarios are provided, within the pseudo-code, that choose conditions in which the other select controls are inactive (e.g., 0). As described herein, the automatically generated property (or properties) is used in formal verification of the multiplexer logic device. The formal verification uses mathematical reasoning, based on the automatically generated property (or properties), to determine with certainty at one time (e.g., concurrently) whether any of the select controls (regardless of the number of select controls in the logic device) comply with the processing condition (e.g., mutual exclusion condition). This is distinct from running simulations in which each select control is tested at a time, causing a plurality of (e.g., numerous) simulations to be executed.

Process 400 performs 440, as an example, formal verification for the one or more identified multiplexer logic devices, based, at least, on the generated verification properties (e.g., mutual exclusion property, other properties, etc.). For formal verification, a property is, e.g., a factual statement about the expected behavior of the logic device, which may be proven true or false using formal verification (e.g., mathematical techniques and/or reasoning, other techniques).

In one example, formal verification 440 uses one or more input constraints 442, including, for instance, clocks, pervasive information (embedded functionality), a functional testing list (e.g., a list for testing of functionality without peering into the internal structures or workings of the logic device), etc. As an example, the one or more input constraints are predefined for the multiplexer logic device. Other examples are possible.

Further, in one example, formal verification uses one or more formal constraints 446. In one example, formal constraints 446 are based on millicode/firmware 444 of the identified logic devices. Millicode is, for instance, a form of microcode, which is, e.g., a layer of hardware-level instructions involved in the implementation of higher-level machine code instructions. In one or more aspects of millicode:

Logic errors in the microcode can be fixed with a reload of the microcode without actual hardware changes; can be used to work around errors in the hardware;

The millicode architecture includes additional instructions and registers not available in the external architecture;

Can use control bits in the R-unit registers to circumvent problems;

As an example, these control bits can be set during initialization to un-enable a function that is working incorrectly. Since millicode can also write these controls during execution, a routine can also, following the same example, un-enable a function when a specific condition exists and re-enable it when the condition no longer exists.

One example of a formal constraint for multiplexer logic devices to, e.g., restrict encryption and decryption instruction hardware availability by checking opcode values is depicted below:

[constraint; common_bus_optype_constraint] <=
(instr.r4_common_bus_data (11 to 15)="00100") or
(instr.r4_common_bus_data (11 to 15)="01000") or
(instr.r4_common_bus_data (11 to 15)="01100");

In the above example, only one register value of the three register values out of, e.g., 32 values is a valid instruction; other values are not to be used in instruction execution. In the above example, one of the values of "00100", "01000" or "01100" allows encryption to occur and a different value allows decryption to occur. Other examples are possible. Further, in the above example, r represents a register and cbus represents a common bus.

In one example, using the inputs (e.g., verification properties and constraints) formal verification is performed. For instance, the inputs are provided to a formal verification tool, now known or later developed, that performs the verification and outputs a result (e.g., pass or fail).

Based on formal verification, in one example, if one or more of the identified logic devices fail to comply with the selected processing condition (e.g., mutual exclusion condition), process 400 determines 450 if there is a waiver for that failure (e.g., may the violation or failure be ignored, bypassed, etc.). If there is a waiver or none of the identified logic devices failed the verification, then the co-debug processing is complete. However, if there is no waiver for at least one of the logic devices that fails to comply with the selected processing condition, process 400 performs debugging 460.

In one example, debugging 460 includes, for instance, performing 462 trace minimizations for one or more multiplexer inputs and performing 464 a selected scenario for debugging (e.g., mutual exclusion; processing-race scenario) based on the trace minimization (e.g., perform selected scenario on a smaller input).

One example of trace minimization customized for multiplexer logic devices includes, for instance, tracing a property back to a source design file/line, generating a minimized counterexample for a specific failure, and automatically extracting failing multiplexer values for logic debugging. The generating the minimized counterexample includes, for example, analyzing multiplexers in the path, minimizing assignments to design signals and marking unnecessary signals as don't care signals; and, e.g., when an AND gate output is, e.g., 0, a heuristic minimizes the number of input values and maximizes don't cares. The automatically extracting includes, for instance, identifying the cone-of-influence of the multiplexer select values, and extracting the paths that could be potential candidates for concurrent activation and processing-racing.

Figure 5:
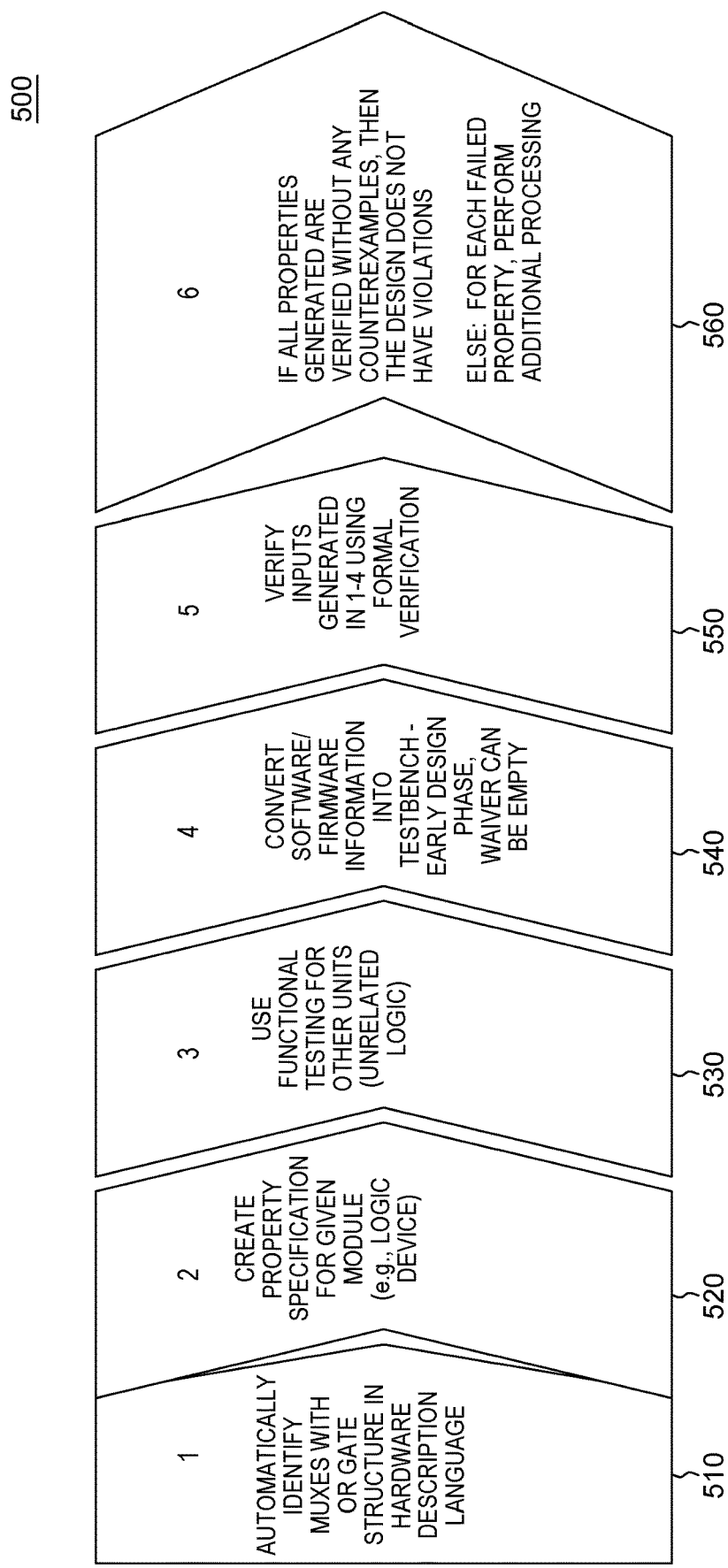
FIG. 5 one example of a flow sequence process used in accordance with one or more aspects of the present disclosure.

Further details relating to performing co-debugging of logic devices are described with reference to FIG. 5. In one example, a flow sequence process (e.g., flow sequence process 500) is used in performing co-debugging of identified logic devices. Flow sequence process 500 may employ one or more of the sub-modules (e.g., sub-modules 300-360) of logic device co-debug module 150. Further, in one example, flow sequence process 500 may be executed by and/or using one or more computing devices (e.g., one or more computers, such as computer(s) 101 and/or other computers; one or more servers, such as remote server(s) 104 and/or other remote servers; one or more devices, such as end user device(s) 103 and/or other end user devices; one or more processors or nodes, such as processor(s) or node(s) of processor set 110 and/or other processor(s) or node(s); processing circuitry, such as processing circuitry 120 of processor set 110 and/or other processing circuitry and/or other computing devices, etc.). Additional and/or other computers, servers, devices, processors, nodes, processing circuitry and/or computing devices may be used to execute the process and/or other aspects of the present disclosure. Many examples are possible.

In one example, flow sequence process 500 (also referred to as process 500) includes, for instance, automatically identifying 510 one or more selected logic devices (e.g., multiplexer logic devices) in, e.g., a hardware description language. This is performed by, e.g., process 500 scanning or searching, etc., the hardware description language for descriptions that describe the selected logic device (e.g., multiple multiplexers driving an OR gate).

Based on the identified logic devices, process 500 automatically creates 520 a property specification for at least one identified logic device. For example, process 500 creates and/or obtains a property specification for a property (e.g., mutual exclusion condition) of the logic device (e.g., multiplexer logic device). The property specification identifies one or more properties automatically generated based on the type of identified logic devices (e.g., multiplexer logic devices).

Further, in one example, process 500 uses 530 a functional testing technique for other units of the design (e.g., unrelated logic—e.g., logic used by and/or associated with the identified logic device but tangential to the logic device itself). With the functional testing technique, the unrelated logic is hidden in that input is provided and output is produced but the specifics of the testing relating to the logic are not transparent and do not weigh down the verification of the logic device.

Process 500 converts 540 software/firmware information relating to the logic device to be tested into a testbench—in an early design phase, the waiver may be empty (i.e., there are no waivers at this point) to reduce spurious failure debug. For instance, a tool executed on a computer (e.g., online tool, other tools, etc.) may be used to create a testbench used to provide one or more formal constraints.

Process 500 verifies 550 the inputs generated in operations 510-540 using, as an example, formal verification. Formal verification is, for instance, the act of proving or disproving the correctness of the device under test, such as a multiplexer logic device, with respect to selected formal properties (e.g., factual statements about the expected or assumed behavior of an object, e.g., a mutual exclusion condition). Formal verification techniques, now known or later developed, may be employed. In one example, for faster formal verification, optionally, verification may be abstracted, and semiformal error searching techniques may be performed. Other examples are possible.

Process 500 performs debugging 560. In one example, if the properties generated are verified without any counterexamples (an exception to a generalization), then, in one example, the design does not have, e.g., any mutual exclusion conditions that fail the verification. However, for each failed property (e.g., mutual exclusion condition, other properties), additional processing is performed. This includes process 500 checking whether the property is waived. If it is not waived, then in one example, process 500 extracts input conditions that are not exclusive through simplification on the counterexample trace. A waiver is created if, for instance, software/firmware addressed the property. Muxselects that are active at the same time are extracted and focused debug assists are generated.

In one or more aspects, the debugging includes classifying one or more of the failures to comply with the processing condition, as indicated by the verification. The classifying the one or more failures includes, for instance, using a reduced set of counterexamples to debug the multiplexer logic device. The reduced set of counterexamples represents a subset of select controls or signals of the multiplexer logic device (e.g., if there are more than two select controls, only two of the controls are used). The subset of select signals is used as one or more selected debugging points for the debugging. In one example, faster trace debug hints are generated indicating, for instance, which select controls are active together resulting in a failed mutual exclusion condition. Other examples are possible.

In one or more aspects, the debugging includes identifying an error within the design, code and/or circuit and correcting for the failure. For instance, the design, code and/or circuit are modified to correct for the failure (e.g., failure to comply with the mutual exclusion condition). In one or more aspects, subsequent to correcting for the failure, one or more of the verification/debug operations are repeated to confirm that the failure has been corrected.

In one or more aspects, a capability is provided to perform co-debugging of selected logic devices (e.g., multiplexer logic devices in which output of a plurality of multiplexers is input to a logic circuit, such as an OR gate). The capability increases robustness in the logic device by, for instance, adding new security features in the register transfer logic; enabling multiple designers to work on one unit (e.g., a logic device or a portion of it); enabling those to work on/with the logic devices that are not necessarily familiar with the logic; enabling possible use cases late in the design cycle; and possibly introducing unintentional violations that can then be debugged, providing a more robust logic device.

In one or more aspects, processing conditions related to multiplexer logic devices (e.g., mutual exclusion conditions) are debugged using hardware/software co-debug techniques and defining constraints specific to the processing conditions. The constraints (e.g., hardware/software constraints) assist in proving the non-existence of the processing conditions using, e.g., formal verification techniques.

In one or more aspects, a formal verification methodology is provided to identify the processing conditions and additional debugging aids are provided to assist in the debugging. In one or more aspects, a process is provided to debug selected processing conditions using the hardware description language and property definitions, independent of hardware accelerators using a programmable logic device environment.

In one or more aspects, a technique for automatic identification of multiplexer logic devices in a hardware description language is provided. In one or more aspects, a property specification for validation of a mutual exclusion condition is defined, while functional testing other logic. In one or more aspects, software and hardware information is simultaneously combined for complete verification using formal techniques, with optional conditional abstraction (e.g., abstraction may be performed, if desired (e.g., if the formal technique takes too long, based on a predefined threshold)). With conditional abstraction, in one example, logic not used by the constraints may be abstracted out. In one or more aspects, classification of failures is provided using minimal counterexamples for extracting active multiplexer selectors for efficient debugging. In one or more aspects, multiplexer select conditions are used as critical points for debugging, minimizing the number of assignments in the counterexample trace. In one or more aspects, faster trace debug hints are generated indicating which multiplexer select signals are active together resulting in a failed mutual exclusion condition.

The computing environments described herein are only examples of computing environments that can be used. One or more aspects of the present disclosure may be used with many types of environments. The computing environments provided herein are only examples. Each computing environment is capable of being configured to include one or more aspects of the present disclosure. For instance, each may be configured to implement and/or perform debug processing and/or to implement and/or perform one or more other aspects of the present disclosure.

One or more aspects of the present disclosure are tied to computer technology and enhance processing within a computer, improving performance thereof. For instance, testing, manufacturing and/or use of the logic devices are improved by co-debugging processing conditions of the logic devices. The co-debugging provides a more robust logic device that enhances accuracy, performance and/or security in those processors and/or computing environments using the logic devices. Such logic devices may be incorporated, implemented and/or used in processors used for many tasks including, but not limited to, computing within a processor, encryption, decryption, other processing, etc. Processing within a processor, computer system and/or computing environment is improved.

One or more aspects of the present disclosure may use machine learning. For instance, machine learning may be used to identify processing conditions, determine properties and/or constraints, provide input for verification, perform analysis and/or perform other tasks. A system is trained to perform analyses and learn from input data and/or choices made.

Machine learning (ML) solves problems that are not solved with numerical means alone. In an ML-based example, program code extracts various attributes from ML training data (e.g., historical data and/or other data collected from various data sources relevant to an event). The attributes are utilized to develop a predictor function, h(x), also referred to as a hypothesis, which the program code utilizes as a machine learning model.

The model generated by the program code is self-learning as the program code updates the model based on active event feedback, as well as from the feedback received from data related to the event. For example, when the program code determines that there is an event or pattern that was not previously predicted by the model, the program code utilizes a learning agent to update the model to reflect the state of the event, in order to improve predictions in the future. Additionally, when the program code determines that a prediction is incorrect, either based on receiving user feedback through an interface or based on monitoring related to the event, the program code updates the model to reflect the inaccuracy of the prediction for the given period of time. Program code comprising a learning agent cognitively analyzes the data deviating from the modeled expectations and adjusts the model to increase the accuracy of the model, moving forward.

In one or more embodiments, program code, executing on one or more processors, utilizes an existing cognitive analysis tool or agent (now known or later developed) to tune the model, based on data obtained from one or more data sources. In one or more embodiments, the program code interfaces with application programming interfaces to perform a cognitive analysis of obtained data. Specifically, in one or more embodiments, certain application programming interfaces comprise a cognitive agent (e.g., learning agent) that includes one or more programs, including, but not limited to, natural language classifiers, a retrieve and rank service that can surface the most relevant information from a collection of documents, concepts/visual insights, trade off analytics, document conversion, and/or relationship extraction. In an embodiment, one or more programs analyze the data obtained by the program code across various sources utilizing one or more of a natural language classifier, retrieve and rank application programming interfaces, and trade off analytics application programming interfaces. An application programming interface can also provide audio related application programming interface services, in the event that the collected data includes audio, which can be utilized by the program code, including but not limited to natural language processing, text to speech capabilities, and/or translation.

In one or more embodiments, the program code utilizes a neural network to analyze event-related data to generate the model utilized to predict the state of a given event at a given time. Neural networks are biologically-inspired programming paradigms, which enable a computer to learn and solve artificial intelligence problems. This learning is referred to as deep learning, which is a subset of machine learning, an aspect of artificial intelligence, and includes a set of techniques for learning in neural networks. Neural networks, including modular neural networks, are capable of pattern recognition with speed, accuracy, and efficiency, in situations where data sets are multiple and expansive, including across a distributed network, including but not limited to, cloud computing systems. Modern neural networks are non-linear statistical data modeling tools. They are usually used to model complex relationships between inputs and outputs or to identify patterns in data (i.e., neural networks are non-linear statistical data modeling or decision making tools). In general, program code utilizing neural networks can model complex relationships between inputs and outputs and identify patterns in data. Because of the speed and efficiency of neural networks, especially when parsing multiple complex data sets, neural networks and deep learning provide solutions to many problems in multiple source processing, which the program code in one or more embodiments accomplishes when obtaining data and generating a model for predicting states of a given event.

Other aspects, variations and/or embodiments are possible.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally, or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

Yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, other logic devices may benefit from one or more aspects of the present disclosure. Moreover, other verification techniques may be used. Many variations are possible.

Various aspects and embodiments are described herein. Further, many variations are possible without departing from a spirit of aspects of the present disclosure. It should be noted that, unless otherwise inconsistent, each aspect or feature described and/or claimed herein, and variants thereof, may be combinable with any other aspect or feature.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method of facilitating processing within a computing environment, the computer-implemented method comprising:
   automatically identifying a multiplexer logic device in a hardware definition language of a design;
   generating one or more verification properties of the multiplexer logic device to be used in validation of a selected processing condition of the multiplexer logic device;
   providing as input to a formal verification technique the one or more verification properties and one or more constraints obtained from software and hardware information relating to the multiplexer logic device;
   performing verification using the formal verification technique to validate the selected processing condition; and
   performing debugging of the multiplexer logic device, based on the performing verification indicating a failure to comply with the selected processing condition.

2. The computer-implemented method of claim 1, wherein the providing as input to the formal verification technique the one or more constraints includes performing functional testing of other logic of the design to obtain at least one constraint of the one or more constraints, the performing the functional testing being performed in lieu of generating other verification properties for the other logic.

3. The computer-implemented method of claim 1, wherein the performing the debugging includes classifying one or more failures to comply with the selected processing condition indicated by the verification.

4. The computer-implemented method of claim 3, wherein the classifying the one or more failures includes using a reduced set of counterexamples to debug the multiplexer logic device.

5. The computer-implemented method of claim 4, wherein the reduced set of counterexamples represents a subset of select signals of the multiplexer logic device, wherein the subset of select signals is used as one or more selected debugging points for the debugging.

6. The computer-implemented method of claim 1, wherein the performing the debugging includes performing a correction to eliminate the failure to comply.

7. The computer-implemented method of claim 6, further comprising repeating at least the performing verification to determine whether the failure to comply has been corrected.

8. The computer-implemented method of claim 1, wherein the multiplexer logic device includes a plurality of multiplexers coupled to a logic circuit, and wherein the selected processing condition comprises a mutual exclusion condition.

9. The computer-implemented method of claim 8, wherein the logic circuit comprises an OR gate.

10. The computer-implemented method of claim 1, wherein the performing verification includes performing semi-formal verification to reduce an amount of time to perform the verification.

11. A computer system for facilitating processing within a computing environment, the computer system comprising:
    at least one computing device;
    a set of one or more computer readable storage media; and
    program instructions, collectively stored in the set of one or more computer readable storage media, for causing the at least one computing device to perform the following computer operations including:
        automatically identifying a multiplexer logic device in a hardware definition language of a design;
        generating one or more verification properties of the multiplexer logic device to be used in validation of a selected processing condition of the multiplexer logic device;
        providing as input to a formal verification technique the one or more verification properties and one or more constraints obtained from software and hardware information relating to the multiplexer logic device;
        performing verification using the formal verification technique to validate the selected processing condition; and
        performing debugging of the multiplexer logic device, based on the performing verification indicating a failure to comply with the selected processing condition.

12. The computer system of claim 11, wherein the providing as input to the formal verification technique the one or more constraints includes performing functional testing for other logic of the design to obtain at least one constraint, the performing the functional testing being performed in lieu of generating other verification properties for the other logic.

13. The computer system of claim 11, wherein the performing the debugging includes classifying one or more failures to comply with the selected processing condition indicated by the verification, wherein the classifying the one or more failures includes using a reduced set of counterexamples to debug the multiplexer logic device.

14. The computer system of claim 13, wherein the reduced set of counterexamples represents a subset of select signals of the multiplexer logic device, wherein the subset of select signals is used as one or more selected debugging points for the debugging.

15. The computer system of claim 11, wherein the multiplexer logic device includes a plurality of multiplexers coupled to a logic circuit, and wherein the selected processing condition comprises a mutual exclusion condition.

16. A computer program product for facilitating processing within a computing environment, the computer program product comprising:
    a set of one or more computer readable storage media; and
    program instructions, collectively stored in the set of one or more computer readable storage media, for causing at least one computing device to perform the following computer operations including:
        automatically identifying a multiplexer logic device in a hardware definition language of a design;
        generating one or more verification properties of the multiplexer logic device to be used in validation of a selected processing condition of the multiplexer logic device;
        providing as input to a formal verification technique the one or more verification properties and one or more constraints obtained from software and hardware information relating to the multiplexer logic device;
        performing verification using the formal verification technique to validate the selected processing condition; and
        performing debugging of the multiplexer logic device, based on the performing verification indicating a failure to comply with the selected processing condition.

17. The computer program product of claim 16, wherein the providing as input to the formal verification technique the one or more constraints includes performing functional testing for other logic of the design to obtain at least one constraint, the performing the functional testing being performed in lieu of generating other verification properties for the other logic.

18. The computer program product of claim 16, wherein the performing the debugging includes classifying one or more failures to comply with the selected processing condition indicated by the verification, wherein the classifying the one or more failures includes using a reduced set of counterexamples to debug the multiplexer logic device.

19. The computer program product of claim 18, wherein the reduced set of counterexamples represents a subset of select signals of the multiplexer logic device, wherein the subset of select signals is used as one or more selected debugging points for the debugging.

20. The computer program product of claim 16, wherein the multiplexer logic device includes a plurality of multiplexers coupled to a logic circuit, and wherein the selected processing condition comprises a mutual exclusion condition.

* * * * *